United States Patent [19]

Enomoto et al.

[11] 4,409,495
[45] Oct. 11, 1983

[54] SCHMITT TRIGGER CIRCUIT WITH LOW INPUT CURRENT

[75] Inventors: Hiromu Enomoto, Kawasaki; Yoshiharu Mitono, Tokyo; Yasushi Yasuda, Inagi; Taketo Imaizumi, Fukuoka; Hiroshi Ohta, Yokohama, all of Japan

[73] Assignee: Fujitsu Limited, Kawasaki, Japan

[21] Appl. No.: 268,643

[22] Filed: May 29, 1981

[30] Foreign Application Priority Data

May 29, 1980 [JP] Japan ................................ 55-71804

[51] Int. Cl.³ ............................................ H03K 3/295
[52] U.S. Cl. .................................... 307/290; 307/263; 307/268; 307/299 A
[58] Field of Search ................... 307/456, 299 A, 300, 307/290, 268, 263, 549, 303

[56] References Cited

U.S. PATENT DOCUMENTS 3,868,517  2/1975  Schoeff .
4,031,413  6/1977  Ohhinata et al. .

Primary Examiner—John Zazworsky
Attorney, Agent, or Firm—Staas & Halsey

[57] ABSTRACT

A Schmitt trigger circuit has an input-voltage hysteresis characteristic for reducing noise sensitivity and preventing oscillation. In its input stage there is a multi-emitter transistor, and in its output stage a second transistor. The multi-emitter transistor comprises a first emitter and a second emitter. The first emitter is associated with a switching operation in response to the input voltage applied to the base of the multi-emitter transistor. The second emitter is associated with the operation of drawing charges from the base of the second transistor through the base of the multi-emitter transistor to the ground. The use of the multi-emitter transistor prevents the input current from increasing greatly as the input voltage falls.

13 Claims, 13 Drawing Figures

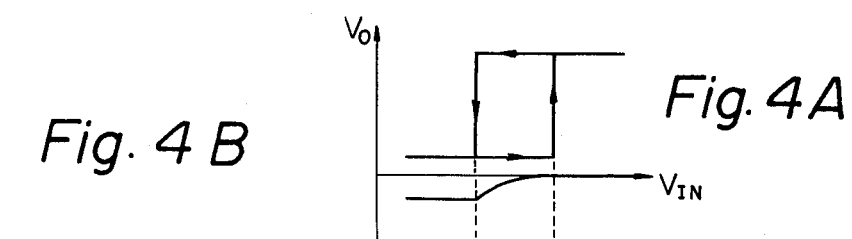
Fig. 4B
Fig. 4A
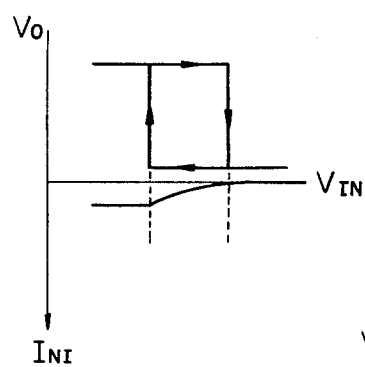
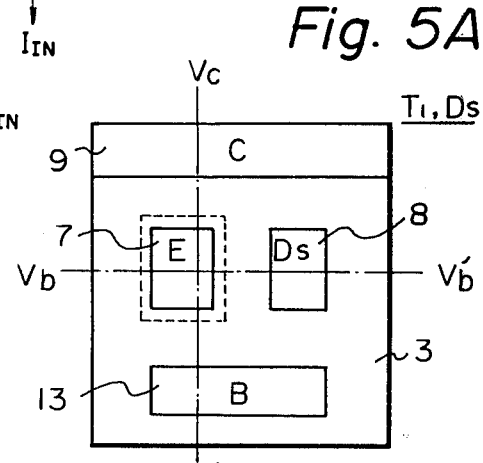
Fig. 5A
Fig. 5B
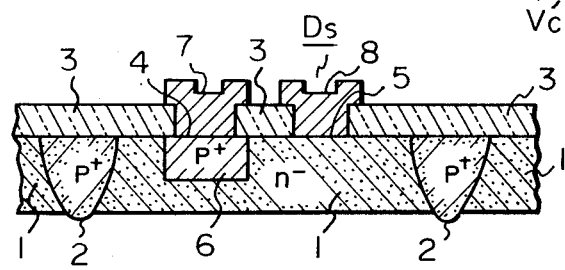
Fig. 5C
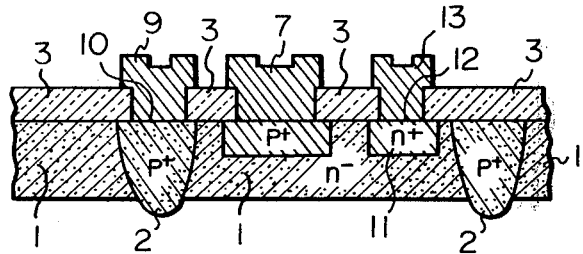

SCHMITT TRIGGER CIRCUIT WITH LOW INPUT CURRENT

BACKGROUND OF THE INVENTION

This invention relates to a Schmitt trigger circuit in which the input threshold voltages associated with the rise or fall of the output voltage have a hysteresis characteristic, that is, the low input threshold voltage ($V_L$), when the input voltage varies from a high level (H) to a low level (L), is different from the high input threshold voltage ($V_H$) when the input voltage varies from the L to the H, and more particularly, to a Schmitt trigger circuit in which the input current does not increase suddenly when the input voltage falls from H to L.

A Schmitt trigger circuit, having a high input threshold voltage ($V_H$) associated with the rise of the input voltage and a low input threshold voltage ($V_L$) associated with the fall of the input voltage, has the advantages of reduced noise sensitivity and of no oscillation near the point of the threshold voltages due to the hysteresis characteristic of the input threshold voltages, as hereinafter described in detail with respect to conventional Schmitt trigger circuits. Therefore, such a Schmitt trigger circuit is advantageously used as an input buffer for various logic circuits, such as flip-flops, shift registers, counters, etc., because the input of the input buffer usually tends to receive noise and is connected to a long bus line along which the input waveform tends to deteriorate.

However, in a conventional circuit, there is the disadvantage of a sudden increase in the input current when the input voltage falls from the high input threshold voltage ($V_H$) to the low input threshold voltage ($V_L$). Because of this sudden increase in the input current, a drive circuit for drawing the input current from the input stage of the Schmitt trigger circuit must have the capability of drawing a larger current than the usual input current.

SUMMARY OF THE INVENTION

Accordingly, an object of the present invention is to provide a Schmitt trigger circuit having a hysteresis characteristic in which the input current does not greatly increase.

Another object of the present invention is to provide a Schmitt trigger circuit in which a multi-emitter transistor is employed in the input stage so that the input current is restricted.

BRIEF DESCRIPTION OF THE DRAWINGS

The foregoing objects and other objects as well as the characteristic features of the invention are more apparent and more readily understandable from the following description when read in conjunction with the accompanying drawings, in which like reference characters designate the same or similar parts throughout the figures thereof, wherein:

FIGS. 4A and 4B are graphs illustrating the input-output voltage characteristics and the input voltage-input current characteristics in the circuits of FIGS. 3A and 3B, respectively;

FIG. 5A is a plan view of the structure of the input stage of the conventional Schmitt trigger circuit of FIG. 1A or 1B;

FIG. 5B is a cross-sectional view of the structure of the input stage taken along the line $V_b$—$V_b'$ of FIG. 5A;

FIG. 5C is a cross-sectional view taken along the line $V_c$—$V_c'$ of FIG. 5A;

DESCRIPTION OF THE PREFERRED EMBODIMENTS

Before describing the embodiments of the present invention, two examples of conventional Schmitt trigger circuits are first explained with reference to FIGS. 1A, 1B, 2A and 2B.

Figure 1A:
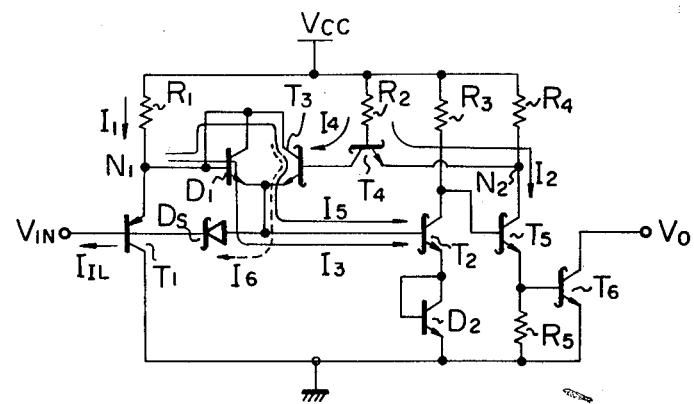
FIG. 1A is a circuit diagram illustrating a conventional Schmitt trigger circuit.

FIG. 1A is a circuit diagram illustrating an example of a conventional Schmitt trigger circuit of a true type, in which a low level and a high level of the input voltage correspond to the low level and the high level of the output voltage, respectively. Referring to FIG. 1A, the input stage consists of a pnp transistor $T_1$ and a load resistor $R_1$ connected between the emitter of the transistor $T_1$ and a power supply $V_{cc}$. The output stage consists of npn transistors $T_2$, $T_5$ and $T_6$, load resistors $R_3$ and $R_4$ connected between the power supply $V_{cc}$ and the collectors of the transistors $T_2$ and $T_5$, respectively, a bias transistor $D_2$ connected between the emitter of the transistor $T_2$ and ground, and a bias resistor $R_5$ connected between the emitter of the transistor $T_5$ and ground. A Schottky barrier diode $D_s$ is connected in the forward direction between the base of the transistor $T_1$ and the base of the transistor $T_2$, for drawing charges on the base of the transistor $T_2$, or, in other words, for the speeding up of the falling time of the output voltage $V_O$. An npn transistor $T_3$ for providing a hysteresis characteristic and an npn transistor $T_4$ for controlling the transistor $T_3$ are disposed between the input stage and the output stage. That is, the collector of the transistor $T_3$ is connected to a node $N_1$ between the resistor $R_1$ and the emitter of the transistor $T_1$. The emitter of the transistor $T_3$ is connected to the base of the transistor $T_2$. The base of the transistor $T_3$ is connected to the collector of the transistor $T_4$. The base of the transistor $T_4$ is connected through a load resistor $R_2$ to the power supply $V_{cc}$. The emitter of the transistor $T_4$ is connected to a node $N_2$ between the resistor $R_4$ and the collector of the transistor $T_5$. The transistors $T_2$ through $T_6$ are Schottky barrier diodes (SBD) of the clamping type in this example. Further, a transistor $D_1$, for determining a threshold voltage $V_H$, is connected in parallel to the transistor $T_3$. That is, the base and the collector of the transistor $D_1$ are short-circuited and are connected to the collector of the transistor $T_3$. Also, the emitter of the transistor $D_1$ is connected to the emitter of the transistor $T_3$. The transistors $D_1$ and $D_2$ are used as pn junction diodes by connecting the bases to the collectors, respectively.

In operation, the base of the transistor $T_1$ receives an input voltage $V_{IN}$. When the input voltage $V_{IN}$ is low (hereinafter referred to as L), for example, 0 V, the transistor $T_1$ is in an ON state so that a current $I_1$ flows through the resistor $R_1$. During this state, the potential at the anode $N_1$ is higher than the potential $V_{IN}$ by the amount of only the base-emitter voltage $V_{BE}$ of the transistor $T_1$. Therefore, the transistor $T_2$ is in the OFF state. In order to turn on the transistor $T_2$, the potential at the node $N_1$ must be higher than the sum of the base-emitter voltages of the transistor $D_1$, $T_2$ and $D_2$, i.e., higher than $3 V_{BE}$. For this purpose, the input voltage $V_{IN}$ must be higher than $2 V_{BE}$ because the potential of the base of the transistor $T_1$ is lower than the potential at the node $N_1$ by the amount of the base-emitter voltage $V_{BE}$. When the input voltage $V_{IN}$ becomes L to turn off the transistor $T_2$, the potential at the base of the transistor $T_5$ becomes high to turn it on. Therefore, a current $I_2$ flows through the resistor $R_2$, the transistor $T_4$, the transistor $T_5$ and the resistor $R_5$ so that the potential at the base of the transistor $T_6$ becomes high to turn it on. As a result, the output voltage $V_o$ of this Schmitt trigger circuit becomes L. In this state, a current $I_4$ does not flow from the base of the transistor $T_4$ to the base of the transistor $T_3$. It should be noted that in the actual operation a pull up circuit (not shown) for raising the output voltage $V_o$ when the transistor $T_6$ is in an OFF state is connected between the power supply $V_{cc}$ and the collector of the transistor $T_6$. The pull up circuit may be a resistor or an active pull up circuit which conducts a current only when the output voltage $V_o$ switches.

When the input voltage $V_{IN}$ is raised from L to a value higher than $2V_{BE}$, the transistor $T_2$ begins to be turned on at the time when the input voltage $V_{IN}$ reaches $2V_{BE}$, because a base current $I_3$ is supplied from the power supply $V_{cc}$ through the resistor $R_1$, the node $N_1$, and the transistor $D_1$ to the base of the transistor $T_2$. When the transistor $T_2$ begins to turn on, the base current of the transistor $T_5$ decreases to turn off the transistor $T_5$, and accordingly to turn off the transistor $T_6$. As a result, the current $I_2$ flowing through the resistor $R_2$, the transistor $T_4$ and the transistor $T_5$ becomes zero, and alternately, a current $I_4$ begins to flow through the base and collector of the transistor $T_4$. The current $I_4$ is supplied to the base of the transistor $T_3$ to turn it on. During this period the transistor $T_3$ is on because the collector-emitter voltage $V_{CE}$ of the transistor $T_3$ is smaller than the base-emitter voltage $V_{BE}$ of the transistor $D_1$. A base current $I_5$ flowing through the resistor $R_1$, the node $N_1$, and the transistor $T_3$ is supplied to the base of the transistor $T_2$. Since the transistors $T_5$ and $T_6$ are turned off, the output voltage $V_o$ becomes a high voltage (hereinafter referred to as H).

In order to turn off the transistor $T_2$ when the input voltage $V_{IN}$ changes from H to L, the potential at the node $N_1$ must be lower than $V_{CE}+2V_{BE}$, which is the sum of the collector-emitter voltage $V_{CE}$ of the transistor $T_3$ and the two base-emitter voltages $2V_{BE}$ of the transistors $T_2$ and $D_2$. Therefore, the low input threshold voltage $V_L$ of the input voltage $V_{IN}$ for changing the output voltage $V_o$ from H to L when the input voltage $V_{IN}$ falls from H to L is equal to $V_{BE}+V_{CE}$, while, the high input threshold voltage $V_H$, for changing the output voltage $V_o$ from L to H when the input voltage $V_{IN}$ rises from L to H, is equal to $2V_{BE}$, as mentioned before. Accordingly, this Schmitt trigger circuit has input threshold voltages with hysteresis characteristics.

Figure 2A:
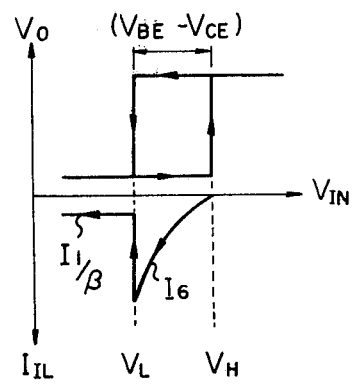
FIG. 2A is a graph illustrating the input-output voltage characteristic and the input voltage-input current characteristic in the circuit of FIG. 1A.

FIG. 2A illustrates the hysteresis characteristic of the input threshold voltages. Referring to the upper portion of FIG. 2A, when the input voltage $V_{IN}$ rises to reach the high input threshold voltage $V_H$ equal to $2V_{BE}$, the output voltage $V_o$ turns from L to H. In contrast, when the input voltage $V_{IN}$ falls from H to the low input threshold voltage $V_L$ equal to $V_{BE}+V_{CE}$, the output voltage $V_o$ turns from H to L. The difference between the high input threshold voltage $V_H$ and the low input threshold voltage $V_L$ is, as illustrated in FIG. 2A, equal to $V_{BE}-V_{CE}$. Usually, the base-emitter voltage $V_{BE}$ is approximately equal to 0.8 V, and the collector-emitter voltage $V_{CE}$ is approximately equal to 0.2 through 0.3 V. Therefore, the difference between $V_H$ and $V_L$ is at least 0.4 V. Because of this difference in the input threshold voltages, the Schmitt trigger circuit of FIG. 1A has the advantages of reduced noise sensitivity and of no oscillation near the point of the threshold voltages when compared with a Schmitt trigger circuit having a fixed input threshold voltage, regardless of the rising or falling of the input voltage.

However, in the circuit of FIG. 1A, because of the Schottky barrier diode $D_s$ for drawing charges on the base of the transistor $T_2$, there is a disadvantage that a large current $I_6$ flows from the power supply $V_{cc}$ through the transistor $T_3$ and the diode $D_s$ to the input when the input voltage falls from H to L, as illustrated in the lower portion of FIG. 2A. More precisely, because the current path through the diode $D_s$ to the input is parallel to the current path from the base of the transistor $T_2$ through the transistor $D_2$ to the ground, the current $I_6$ begins to flow when the input voltage $V_{IN}$ falls so that the sum of the input voltage $V_{IN}$ and a voltage drop $V_F$ across the diode $D_S$ approaches $2V_{BE}$ which is equal to the sum of the base-emitter voltages of the transistors $T_2$ and $D_2$. For example, when the sum of the $V_{IN}$ and $V_F$ is equal to $2V_{BE}$, then, the base current $I_5$ is equal to the current $I_6$. As a result, the base current $I_{IL}$ flowing through the base of the transistor $T_1$ is suddenly but temporarily increased while the input voltage $V_{IN}$ falls from the $V_H$ to the $V_L$, as illustrated in the lower portion of FIG. 2A. When the input voltage $V_{IN}$ is lowered to a value immediately above the low input threshold voltage $V_L$, the input current $I_{IL}$ reaches a maximum value. Then, when the input voltage $V_{IN}$ reaches the $V_L$, transistor $T_1$ is turned on. In this state, the current $I_4$ does not flow as hereinbefore described, and thus the transistor $T_3$ is turned off. Therefore, the current $I_6$ becomes zero. The input current $I_{IL}$ then is reduced to the value $I_1/\beta$, where $\beta$ is the current amplification factor of the transistor $T_1$ usually having a value on the order of 20 to 30.

The characteristic feature of a Schmitt trigger circuit employing a pnp transistor at its input stage such as shown in FIG. 1A is its low input current. Therefore, the Schmitt trigger circuit can be driven by using a low current source, such as a CMOS circuit. However, because of the sudden increase in the input current $I_{IL}$ as described above, the current source (not shown), which is to be connected to the input of the Schmitt trigger circuit of FIG. 1A, must be capable of drawing a large current. The CMOS drive circuit can not draw such a large current. Moreover, if a current source is to be connected to a plurality of Schmitt trigger circuits, the problem of not being capable of drawing such a large current becomes more serious.

Figure 1B:
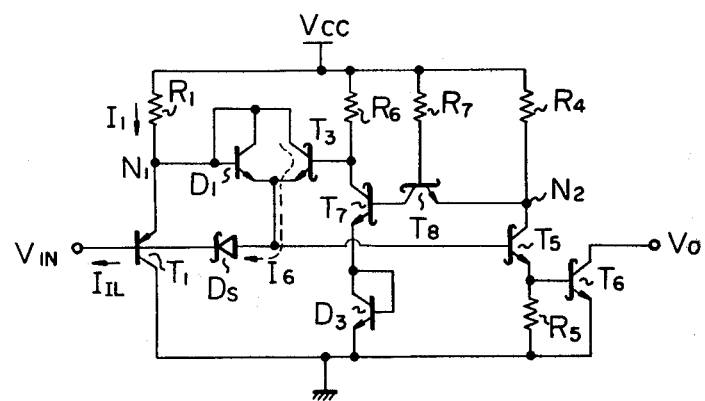
FIG. 1B is a circuit diagram illustrating another conventional Schmitt trigger circuit.

The problem of conducting a large input current also occurs in a conventional inverted-type Schmitt trigger circuit, an example of which is illustrated in FIG. 1B. The difference between the circuits of FIGS. 1A and 1B is that instead of connecting a circuit comprised of the resistors $R_2$ and $R_3$, and the transistors $T_2$, $T_4$ and $D_2$ in the circuit of FIG. 1A, a circuit comprising resistors $R_6$ and $R_7$, and npn transistors $T_7$, $T_8$ and $D_3$ is connected between the input stage and the output stage in FIG. 1B. The resistor $R_6$ is connected between the power supply $V_{cc}$ and the collector of the transistor $T_7$. The base of the transistor $T_3$ is also connected to the collector of the transistor $T_7$. The resistor $R_7$ is connected between the power supply $V_{cc}$ and the base of the transistor $T_8$. The collector of the transistor $T_8$ is connected to the base of the transistor $T_7$. The emitter of the transistor $T_8$ is connected to the collector of the transistor $T_5$. The emitter of the transistor $T_7$ is connected to the collector and the base of the transistor $D_3$. The emitter of the transistor $D_3$ is connected to the ground.

Figure 2B:
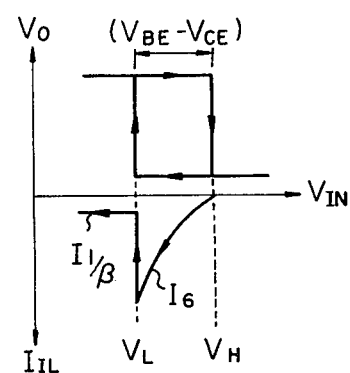
FIG. 2B is a graph illustrating the input-output voltage characteristic and the input voltage-input current characteristic in the circuit of FIG. 1B.

The upper portion of FIG. 2B illustrates the hysteresis characteristic of the input threshold voltages of the circuit of FIG. 1B. In operation of the circuit of FIG. 1B, when the input voltage falls from H to L so that the input voltage $V_{IN}$ becomes lower than the low input threshold voltage $V_L$, the transistor $T_1$ turns on. When the transistor $T_1$ is in the ON state, the transistor $T_5$ is not supplied with its base current because the potential at the node $N_1$ is too low. Therefore, the transistor $T_5$ and accordingly the transistor $T_6$ are in their OFF states so that the output voltage $V_o$ is H. In contrast, when the input voltage $V_{IN}$ rises from L to H, the transistor $T_1$ turns off when the input voltage $V_{IN}$ becomes higher than the high input threshold voltage $V_H$. When the transistor $T_1$ is in the OFF state, the transistors $T_5$ and $T_6$ are in their ON states so that the output voltage $V_o$ is L. The transistor $T_3$ is in an OFF state when the input voltage $V_{IN}$ is L, because the transistor $T_5$ is in its OFF state, so that the potential at the node $N_2$ is equal to $V_{cc}$, and accordingly, a current flows through the resistor $R_7$ and the base-collector of the transistor $T_8$ to provide a base current to the transistor $T_7$ to turn it on. Therefore, the transistor $T_3$ does not receive a base current when the input voltage $V_{IN}$ is L. In contrast, when the input voltage $V_{IN}$ is H, the transistor $T_3$ is in an ON state because the transistor $T_5$ is in an ON state so that the potential at the node $N_2$ is decreased. Therefore, a current flows through the base-emitter of the transistor $T_8$, the transistor $T_5$ and the resistor $R_5$. Accordingly, the transistor $T_7$ does not receive the base current. As a result, the transistor $T_3$ receives its base current from the power supply $V_{cc}$ through the resistor $R_6$, when the input voltage $V_{IN}$ is H. As in the circuit of FIG. 1A, the current $I_6$ flowing through the transistor $T_3$ and the diode $D_s$ is also generated in the circuit of FIG. 1B when the input voltage $V_{IN}$ falls from H to L, as illustrated in the lower portion of FIG. 2B.

According to the present invention, instead of the Schottky barrier diode $D_s$ used in the conventional circuit of FIG. 1A of FIG. 1B, a multi-emitter transistor is employed for suppressing such a large input current during the falling of the input voltage. Embodiments of the present invention are described below.

Figure 3A:
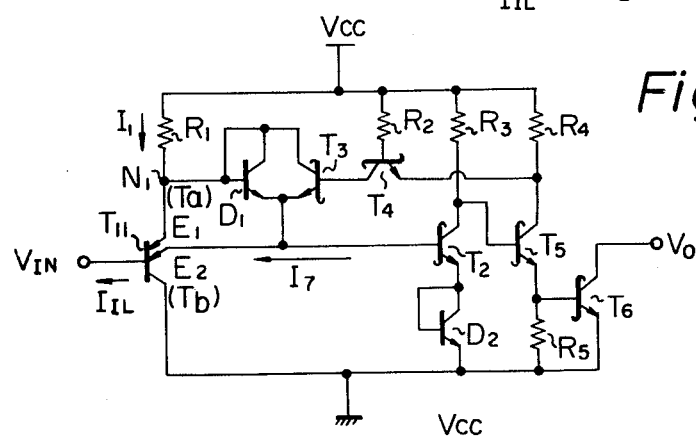
FIG. 3A is a circuit diagram illustrating a Schmitt trigger circuit according to an embodiment of the present invention.

FIG. 3A is a circuit diagram illustrating a Schmitt trigger circuit according to one embodiment of the present inventon. The circuit of FIG. 3A is of a true type in which the L level and the H level of the input voltage $V_{IN}$ correspond to the L level and the H level of the output voltage $V_o$, respectively. The difference between the conventional circuit shown in FIG. 1A and the circuit shown in FIG. 3A is that, the Schottky barrier diode $D_s$ used in the circuit of FIG. 1A is not employed in the circuit of FIG. 3A, and instead of the pnp transistor $T_1$, a multi-emitter pnp transistor $T_{11}$ is employed in FIG. 3A. The first emitter $E_1$ of the transistor $T_{11}$ is connected to the load resistor $R_1$. The second emitter $E_2$ of the transistor $T_{11}$ is connected to the base of the transistor $T_2$ as well as to the emitters of the transistors $D_1$ and $T_3$. By this construction, the multi-emitter transistor $T_{11}$ not only operates in a way similar to the transistor $T_1$ in FIG. 1A, but also operates to solve the problem caused by the circuit of FIG. 1A.

The operation of the circuit of FIG. 3A is described with reference to FIG. 4A, which is a graph illustrating the input-output voltage characteristic and the input voltage-input current characteristic. Referring to the upper portion of FIG. 4A, the hysteresis characteristic of the input threshold voltage is the same as that illustrated in FIG. 2A for the conventional circuit of FIG. 1A because a first transistor $T_a$ of the multi-emitter transistor $T_{11}$ consisting of the first emitter $E_1$, the base and the collector, operates in the same way as the transistor $T_1$ in the circuit of FIG. 1A. However, as can be seen from the lower portion of FIG. 4A, a sudden increase in the input current $I_{IN}$ is not generated while the input voltge $V_{IN}$ falls from H to L. That is, during the period in which the input voltage is falling from $V_H$ to the $V_L$, transistor $T_a$ begins to turn on. Therefore, the potential at the node $N_1$ is higher than the input voltage $V_{IN}$ by the amount of the voltage $V_{BE}$ between the base and the first emitter $E_1$ of the transistor $T_a$. In contrast, if a current such as the current $I_6$ in FIG. 1A could flow through the transistor $T_3$ and the second emitter $E_2$ to the base of a second transistor $T_b$ which consists of the second emitter $E_2$, the base and the collector of the transistor $T_{11}$, then the voltage drop between the collector of the transistor $T_3$ and the base of the transistor $T_{11}$ would be equal to the sum of $V_{CE}$ and $V_{BE}'$, where $V_{BE}'$ is the base-second emitter $E_2$ voltage of the transistor $T_b$. Since $V_{BE}'$ is nearly equal to $V_{BE}$, $V_{BE}' + V_{CE}$ is greater than $V_{BE}$. Therefore, the current path through the transistor $T_3$ and the second emitter $E_2$ to the base can not substantially exist during this period. As a result, the input current $I_{IN}$ is equal to $I_1/\beta_a$, where $\beta_a$ is the current amplification factor of the transistor $T_a$. If a current flows through the transistor $T_b$ in a transient state of the transistor $T_{11}$, the current will be decreased by a factor of $\beta_b$, where $\beta_b$ is the current amplification factor of the transistor $T_b$, and nearly equal to $\beta_a$. In either case, $I_{IL}$ is substantially equal to $I_1/\beta_a$.

Further, the transistor $T_b$ in the multi-emitter transistor $T_{11}$ acts to draw charges to ground from the base of the transistor $T_2$ for the speeding up of the operation when the input voltage falls as the Schottky barrier diode $D_s$ did in the circuit of FIG. 1A. That is, when the input voltage $V_{IN}$ falls to a value lower than the low input threshold voltage $V_L$, the transistor $T_b$ is completely turned on so that charges on the base of the transistor $T_2$ are drawn to the second emitter $E_2$ as a current $I_7$. Due to the current amplification factor $\beta_b$ of the transistor $T_b$, the current $I_7$ is reduced to $I_7/\beta_b$ at the base of the transistor $T_b$.

Figure 3B:
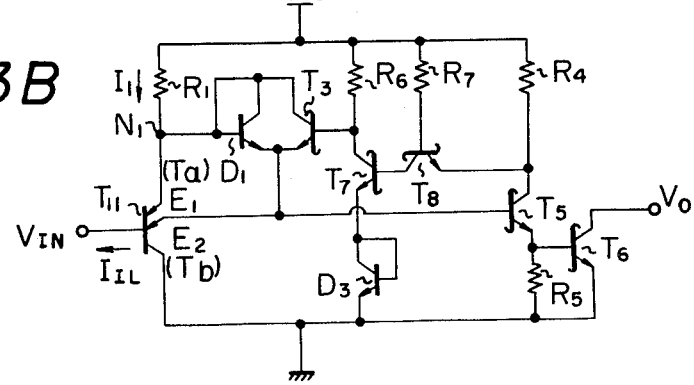
FIG. 3B is a circuit diagram illustrating a Schmitt trigger circuit according to another embodiment of the present invention.

FIG. 3B is a circuit diagram illustrating a Schmitt trigger circuit according to another embodiment of the present invention. The circuit of FIG. 3B is of an inverted type in which the L level and the H level of the input voltage $V_{IN}$ correspond to the H level and the L level of the output voltage $V_o$, respectively. Referring to FIG. 3B, the multi-emitter transistor $T_{11}$ is also employed. The other portion is the same as the corresponding portion in the conventional circuit of FIG. 1B. The operation of the circuit of FIG. 3B may be easily understood by those skilled in the art from the foregoing description and by referring to FIG. 4B, which is a graph illustrating the input-output voltage characteristic and the input voltage-input current characteristic in the circuit of FIG. 3B. Therefore, further description with respect to the circuit of FIG. 4B is not provided here.

The multi-emitter transistor $T_{11}$ can easily be integrated with the other elements on a semiconductor substrate without serious design alteration of the conventional Schmitt trigger circuit of FIG. 1A or 1B. This is easily understood from the following description with reference to FIGS. 5A, 5B, 5C, 6A and 6B. FIG. 5A is a plan view of the structure of the transistor $T_1$ and the Schottky barrier diode $D_s$ illustrated in the conventional Schmitt trigger circuit of FIG. 1A or 1B. FIGS. 5B and 5C are cross-sectional views taken along the lines $V_b$—$V_b'$ and $V_c$—$V_c'$ of FIG. 5A. Referring to FIG. 5A, the electrodes 9, 7, and 13 of the collector C, the emitter E and the base B of the transistor $T_1$, respectively, and the anode electrode 8 of the Schottky barrier diode $D_s$ are disposed on a surface of an insulating layer 3. Referring to FIG. 5B, in an n⁻-type epitaxial layer 1, a $\alpha p^+$-type isolation region 2 is formed for electrically separating the transistor $T_1$ and the diode $D_s$ from the other elements on the Schmitt trigger circuit. On the n⁻-type epitaxial layer 1 and the isolation region 2, the insulation layer 3 of, for example, $SiO_2$, is formed. A window 4 for forming the emitter E of the transistor $T_1$ and a window 5 for forming the Schottky barrier of the diode $D_s$ is provided in the insulation layer 3. A p⁺-type diffusion region 6 is formed by diffusing p⁺-type impurity atoms through the window 4. On the window 4, an aluminum electrode 7 for the emitter E of the transistor $T_1$ is formed. On the window 5, an aluminum electrode 8 for the anode of the diode $D_s$ is formed. The Schottky barrier of the diode $D_s$ is formed by the contact of the aluminum layer 8 to the n⁻-type epitaxial layer 1. Referring to FIG. 5C, an aluminum electrode 9 for the collector C is formed on a window 10 which makes an electrical contact joining the p⁺-type region 2 to the alumimum electrode 9. An n⁺-type diffusion region 11 for the base contact is formed by diffusing n⁺-type impurity atoms through a window 12. On the window 12, an aluminum electrode 13 is formed to be the base electrode.

Figure 6A:
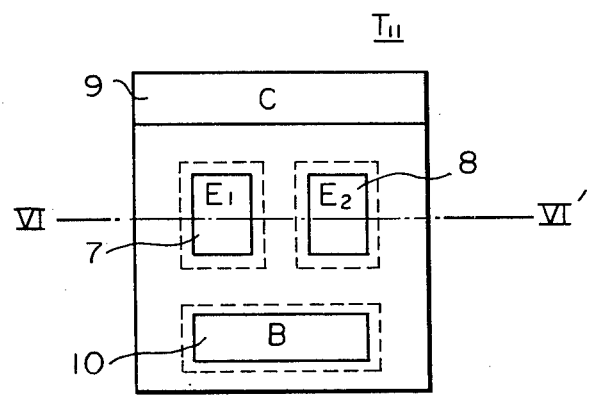
FIG. 6A is a plan view of the structure of the input stage of the Schmitt trigger circuit of FIG. 3A or 3B.
Figure 6B:
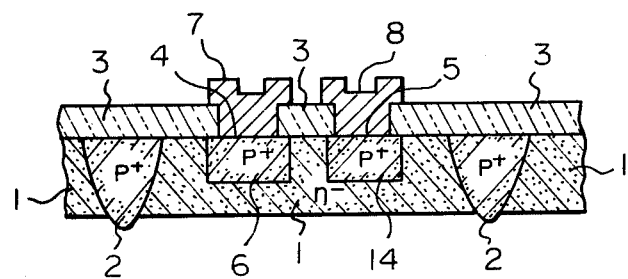
FIG. 6B is a cross-sectional view taken along the line VI—VI' of FIG. 6A.

FIG. 6A is a plan view of the structure of the multi-emitter transistor $T_{11}$ illustrated in FIG. 3A or 3B. FIG. 6B is a cross-sectional view taken along the line VI—VI' of FIG. 6A. The only difference between the structures of the conventional circuit illustrated in FIGS. 5A through 5C and of the embodiment of the present invention illustrated in FIGS. 6A and 6B is that in FIG. 6B a p⁺-type diffusion region 14 is formed by diffusing p⁺-type impurity atoms through the window 5. The region 14 acts as the second emitter $E_2$. While the region 6 acts as the first emitter $E_1$. Because no additional process step is required for forming the p⁺-type region 14, the multi-emitter transistor $T_{11}$ can easily be integrated with the other elements of the Schmitt trigger circuit.

Instead of forming the multi-emitter transistor $T_{11}$, a capacitor or a pn junction diode may be formed in place of the Schottky barrier diode $D_s$. However, if a capacitor or a pn junction diode is formed for suppressing the sudden increase in the input current, additional steps of, for example, forming isolation regions, are required, so that the manufacturing steps become complicated and the chip area is increased. Therefore, in view of the circuit integration, the multi-emitter transistor has the distinct advantage of being able to suppress any sudden increase in the input current compared to a capacitor or a pn junction diode.

From the foregoing description, it will be apparent that according to the present invention in a Schmitt trigger circuit having input threshold voltages with a hysteresis characteristic for reducing input noise sensitivity and for preventing oscillation at a point near the threshold voltages, a sudden increase in the input current during falling of the input voltage is greatly suppressed by employing a multi-emitter transistor in the input stage.

It is apparent that the present invention is not restricted to the illustrated embodiments but various changes and modifications are possible without departing from the basic scope of the invention. For example, although the transistors $T_2$ through $T_8$ are of Schottky barrier clamping type in the foregoing embodiments, these transistors may be of any bipolar type. Also, although no buried layer is illustrated in the structure of the conventional Schmitt trigger circuit, a buried layer is usually formed for reducing a DC resistance of the diode $D_s$. The structure of the Schmitt trigger circuit according to the present invention may of course include such a buried layer.

I claim:

1. A Schmitt trigger circuit having an input-voltage hysteresis characteristic, comprising:
    an input stage comprising a first transistor which is a multi-emitter transistor having first and second emitters, and a first load resistor connected to said first emitter at a node;
    an output stage comprising a second transistor having a base connected to said second emitter of said first transistor;
    a first pn junction diode having an anode connected to said node and a cathode connected to the base of said second transistor, for turning on said second transistor by applying a voltage lower than the voltage at said node by the amount of the voltage drop across said first pn junction diode;
    a third transistor having a collector and an emitter connected to said first pn junction diode, for providing said input-voltage hysteresis characteristic; and
    a switching circuit, connected to said second and third transistors, for turning on said third transistor in response to a turning on of said second transistor.

2. A Schmitt trigger circuit as set forth in claim 1, wherein said first transistor is a multi-emitter pnp type transistor further comprising a base connected for receiving the input voltage of the Schmitt trigger circuit, and a collector connected to ground.

3. A Schmitt trigger circuit as set forth in claim 2, further comprising a power supply, wherein said first load resistor is connected between said power supply and said node.

4. A Schmitt trigger circuit as set forth in claim 3, wherein said first pn junction diode comprises an npn transistor having an emitter functioning as said cathode and having a base and a collector which are short-circuited and connected to said node to function as said anode, wherein said third transistor has a collector connected to the collector of said first pn junction diode at said node, and wherein said third transistor has an emitter connected to the emitter of said first pn junction diode and to said second emitter of said first transistor.

5. A Schmitt trigger circuit as set forth in claim 4, wherein said second and third transistors are npn type transistors.

6. A Schmitt trigger circuit as set forth in claim 5, wherein said second and third transistors are Schottky barrier clamping type transistors.

7. A Schmitt trigger circuit as set forth in claim 5 or 6, wherein said switching circuit comprises:
a second load resistor connected to said power supply; and
a fourth transistor which is an npn transistor having a base connected to said load resistor, and having a collector connected to the base of said third transistor.

8. A Schmitt trigger circuit as set forth in claim 7, wherein said Schmitt trigger circuit further comprises:
a second pn junction diode connected between the emitter of said second transistor and ground; and
a third load resistor connected to said power supply and the collector of said second transistor.

9. A Schmitt trigger circuit as set forth in claim 7, wherein said output stage further comprises:
a third load resistor having a first terminal connected to said power supply and having a second terminal;
a fifth transistor which is npn transistor having a base connected to the collector of said second transistor, having a collector connected to the emitter of said fourth transistor and to said second terminal of said third load resistor, and having an emitter; and
a bias resistor connected to the emitter of said fifth transistor and to ground.

10. A Schmitt trigger circuit as set forth in claim 9, wherein said output stage further comprises a sixth transistor which is npn transistor having a base connected to the emitter of said fifth transistor, having a collector connected as an output terminal of said Schmitt trigger circuit, and having an emitter connected to ground.

11. A Schmitt trigger circuit as set forth in claim 5 or 6, wherein said switching circuit comprises:
a second load resistor having a first terminal connected to said power supply and having a second terminal;
a third load resistor having a first terminal connected to said power supply and having a second terminal;
a fourth transistor which is an npn transistor having a collector connected to the base of said third transistor and to the second terminal of said second load resistor, having a base, and having an emitter; said Schmitt trigger circuit further comprising:
a second pn junction diode connected to the emitter of said fourth transistor and to ground;
a fifth transistor which is an npn transistor having a base connected to said second terminal of said third load resistor, having an emitter connected to the collector of said second transistor, and having a collector connected to the base of said fourth transistor.

12. A Schmitt trigger circuit as set forth in claim 11, further comprising:
a bias resistor connected to ground; and
a fourth load resistor having a first terminal connected to said power supply and having a second terminal, wherein said second transistor has a collector connected to the second terminal of said fourth load resistor, and an emitter connected to said bias resistor.

13. A Schmitt trigger circuit as set forth in claim 12, wherein said output stage further comprises a sixth transistor which is an npn transistor having a base connected to the emitter of said second transistor, having a collector connected as an output terminal of said Schmitt trigger circuit, and having an emitter connected to ground.

* * * * *

UNITED STATES PATENT AND TRADEMARK OFFICE
CERTIFICATE OF CORRECTION

PATENT NO. : 4,409,495
DATED : October 11, 1983
INVENTOR(S) : Enomoto et al.

It is certified that error appears in the above-identified patent and that said Letters Patent is hereby corrected as shown below:

Column 4, line 53, after "reaches" delete "the";
after "$V_L$," insert -- the --.

Column 7, line 36, change "ap$^+$-type" to -- a p$^+$-type --.

Column 10, line 5, after "is" insert -- an --.

Signed and Sealed this

Sixth Day of March 1984

[SEAL]

Attest:

Attesting Officer

GERALD J. MOSSINGHOFF
Commissioner of Patents and Trademarks